United States Patent
Guo et al.

(10) Patent No.: US 9,957,967 B2
(45) Date of Patent: May 1, 2018

(54) DIRECT-CURRENT FAN CONTROL CHIP (71) Applicant: MultiDimension Technology Co., Ltd., Zhangjiagang (CN)

(72) Inventors: Haiping Guo, Zhangjiagang (CN); Dan Li, Zhangjiagang (CN); Songsheng Xue, Zhangjiagang (CN); James Geza Deak, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 0 days. days.

(21) Appl. No.: 15/304,285

(22) PCT Filed: Apr. 13, 2015

(86) PCT No.: PCT/CN2015/076430
§ 371 (c)(1),
(2) Date: Oct. 14, 2016

(87) PCT Pub. No.: WO2015/158231
PCT Pub. Date: Oct. 22, 2015

(65) Prior Publication Data
US 2017/0037859 A1 Feb. 9, 2017

(30) Foreign Application Priority Data
Apr. 14, 2014 (CN) .................... 2014 2 0178713 U (51) Int. Cl.
*H01L 29/82* (2006.01)
*F04D 27/00* (2006.01)
(Continued)

(52) U.S. Cl.
CPC ......... *F04D 27/00* (2013.01); *F04D 25/0666* (2013.01); *G01P 3/487* (2013.01);
(Continued)

(58) Field of Classification Search
CPC . H01L 2224/48091; H01L 2924/00014; H01L 2224/48145; H01L 25/16;
(Continued)

(56) References Cited

U.S. PATENT DOCUMENTS

2005/0024977 A1* 2/2005 Ong .................... G11C 29/1201
365/232
2008/0170091 A1* 7/2008 Ito ........................ B41J 2/04541
347/11
(Continued)

FOREIGN PATENT DOCUMENTS

CN 102253700 11/2011
CN 103244447 8/2013
(Continued)

OTHER PUBLICATIONS

"International Application No. PCT/CN2015/076430, International Search Report and Written Opinion dated Jul. 21, 2015", (Jul. 21, 2015), 10 pgs.

*Primary Examiner* — Robert Bachner
(74) *Attorney, Agent, or Firm* — Schwegman Lundberg & Woessner, P.A.

(57) ABSTRACT

A direct-current fan control chip comprises a magnetoresistive sensor, a controller, a driver and a substrate. The magnetoresistive sensor, the controller and the driver are integrated on the substrate. The sensing direction of the magnetoresistive sensor is perpendicular to or parallel to the surface of the direct-current fan control chip. The magnetoresistive sensor provides the controller with a rotor position signal, a rotor speed signal, and rotor a rotation direction signal for the controller. The controller outputs a control signal to the driver according to the received signals. After receiving the control signals, the driver outputs a drive
(Continued)

signal. This control chip has the advantages of good temperature stability, good frequency response and so on.

20 Claims, 5 Drawing Sheets

(51) Int. Cl.
    *F04D 25/06*     (2006.01)
    *G01P 3/487*     (2006.01)
    *G01R 33/09*     (2006.01)
    *H01L 25/16*     (2006.01)
    *H01L 43/02*     (2006.01)
    *H01L 43/08*     (2006.01)
    *H01L 43/10*     (2006.01)

(52) U.S. Cl.
    CPC ............ *G01R 33/091* (2013.01); *H01L 25/16* (2013.01); *H01L 43/02* (2013.01); *H01L 43/08* (2013.01); *H01L 43/10* (2013.01); *H01L 2224/48091* (2013.01); *H01L 2224/48145* (2013.01)

(58) Field of Classification Search
    CPC ......... H01L 43/02; H01L 43/08; H01L 43/10; F04D 25/0666; F04D 27/00; G01P 3/487; G01R 33/091
    See application file for complete search history.

(56) References Cited

U.S. PATENT DOCUMENTS

| | | | |
|---|---|---|---|
| 2008/0218140 | A1 | 9/2008 | Liao et al. |
| 2009/0027047 | A1* | 1/2009 | Kinzel ................. G01R 33/07 324/235 |
| 2012/0301321 | A1* | 11/2012 | Wu ..................... H05K 7/20209 417/1 |
| 2014/0042949 | A1* | 2/2014 | Karwath ............... F04D 27/001 318/504 |

FOREIGN PATENT DOCUMENTS

| | | |
|---|---|---|
| CN | 103455114 | 12/2013 |
| CN | 203809329 | 9/2014 |
| WO | WO-2015/158231 | 10/2015 |

\* cited by examiner

DIRECT-CURRENT FAN CONTROL CHIP

PRIORITY CLAIM TO RELATED APPLICATIONS

This application is a U.S. national stage application filed under 35 U.S.C. § 371 from International Application Serial No. PCT/CN2015/076430, which was filed 13 Apr. 2015, and published as WO2015/158231 on 22 Oct. 2015, and which claims priority to Chinese Application No. 201420178713.2, filed 14 Apr. 2014, which applications and publication are incorporated by reference as if reproduced herein and made a part hereof in their entirety, and the benefit of priority of each of which is claimed herein.

TECHNICAL FIELD

The present invention relates to a control chip, and in particular, to a direct-current fan control chip that uses a magnetoresistive sensor.

BACKGROUND ART

With the development of science and technology and the improvement of quality of life, the performance of electronic products is continually improving. The enhancement of the performance of most electronic products is often accompanied by increased power consumption, and more heat is generated correspondingly. The electronic products cannot dissipate heat on their own but need to dissipate heat by adding a fan.

At present, cooling fans prevailing on the market are mainly fans that use a brushless direct-current motor. In the brushless direct-current motor, the position of a rotor determines which stator coil is to be driven, and the position of stator flux vector has to be synchronous with the position of rotor flux vector, such that the motor operates smoothly. To achieve such an objective, it is necessary to know the position of the rotor to determine a stator coil to be driven, lots of existing technologies can achieve such an objective, and the most commonly used technology is monitoring the position of the rotor by using a Hall Effect magnetic sensor. However, the Hall Effect sensor is great in size and weight, thus increasing the system cost and reducing the reliability. In addition, the sensor has poor temperature stability and high power consumption.

The Tunneling Magnetoresistive (TMR) magnetic sensor is a new magnetoresistive effect sensor that has been applied within the industry in recent years, which senses magnetic fields by using the tunnel magnetoresistive effect of magnetic multi-layer film materials, and has a smaller size, lower power consumption and a broader working range relative to the Hall Effect magnetic sensor. More importantly, compared with the traditional Hall sensor, the TMR sensor has an absolute predominance in terms of temperature stability and is more suitable for applications in environments with greater temperature changes. In a system with obvious heat generation, the range of changes in temperature of an environment where a fan control chip is located is broad, and the TMR sensor is more applicable thereto.

SUMMARY OF THE INVENTION

An objective of the present invention is to overcome the above problems existing in the prior art, so as to provide a direct-current fan control chip with a small size, low cost, low power consumption and broad working range.

In order to achieve the above technical objective and achieve the above technical effect, the present invention is implemented by the following technical solution:

The present invention provides a direct-current fan control chip, wherein the direct-current fan control chip includes a magnetoresistive sensor, a controller, a driver and a substrate, the sensing direction of the magnetoresistive sensor is perpendicular to or parallel to the surface of the direct-current fan control chip, the magnetoresistive sensor provides the controller with a rotor position signal, a rotor speed signal, and a rotor rotation direction signal, the controller outputs a control signal to the driver according to the received signals, after receiving the control signals, the driver outputs a drive signal, and the magnetoresistive sensor, the controller and the driver are all integrated on the substrate.

Preferably, the magnetoresistive sensor is a single-chip sensor, and is formed by InSb elements, TMR elements, GMR elements or AMR elements that are electrically connected.

Preferably, the magnetoresistive sensor is a single-axis sensor, a two-axis sensor or a three-axis sensor.

Preferably, the single-axis sensor is an X-axis sensor, a Y-axis sensor or a Z-axis sensor.

Preferably, the magnetoresistive sensor, the controller and the driver are separately integrated on the substrate.

Preferably, the magnetoresistive sensor, the controller and the driver are stacked.

Preferably, the magnetoresistive sensor is located above or beneath the controller.

Preferably, the magnetoresistive sensor is located above or beneath the driver.

Preferably, the controller and the driver are deposited on the same wafer to form a control driver, the control driver being located on the substrate.

Preferably, the controller, the driver and the magnetoresistive sensor are deposited on the same wafer to form an inductive control driver, the inductive control driver being located on the substrate.

Preferably, the magnetoresistive sensor is located above or beneath the control driver.

Preferably, the direct-current fan control chip further includes the following input and output terminals: a temperature signal input terminal, a drive signal output terminal, an alarm signal output terminal and a programmable I/O terminal, wherein the temperature signal input terminal, the alarm signal output terminal and the programmable I/O terminal are all disposed on the controller, and the drive signal output terminal is disposed on the driver.

Preferably, the direct-current fan control chip is packaged in the following forms: SIP (single in-line package), DIP (dual inline package), SOP (small outline package), QFN (quad flat non-leaded package), DFN (dual flat non-leaded package), BGA (Ball Grid Array), LGA (land grid array), PGA (pin-grid array), TO (transistor out-line), QFP (quad flat package), SOT (small out-line transistor), LCC (lead on chip), COB (chip on board), COC (ceramic substrate on chip), CSP (chip scale package), MCM (multi-chip module) or ceramic shell package.

Preferably, the control signal includes at least one PWM (Pulse Width Modulation) signal.

Compared with the prior art, the present invention has the following beneficial effects:

(1) The magnetoresistive sensor is integrated with the controller and the driver, which reduces the size and also reduces the device cost and the assembling cost;

(2) The magnetoresistive sensor has low power consumption, especially the TMR sensor;

(3) The magnetoresistive sensor represented by the TMR sensor has good temperature stability, a wide dynamic range and high reliability.

BRIEF DESCRIPTION OF DRAWINGS

To describe the technical solutions of the technical embodiments of the present invention more clearly, accompanying drawings that need to be used in the technical embodiments are introduced briefly. Obviously, the accompanying drawings described in the following are only some of the possible embodiments of the present invention, and those of ordinary skill in the art can further obtain other drawings according to the accompanying drawings without any creative effort.

DETAILED DESCRIPTION OF THE PREFERRED EMBODIMENTS

The content of the present invention will be further described below with reference to the accompanying drawings and embodiments.

Embodiments

Figure 1:
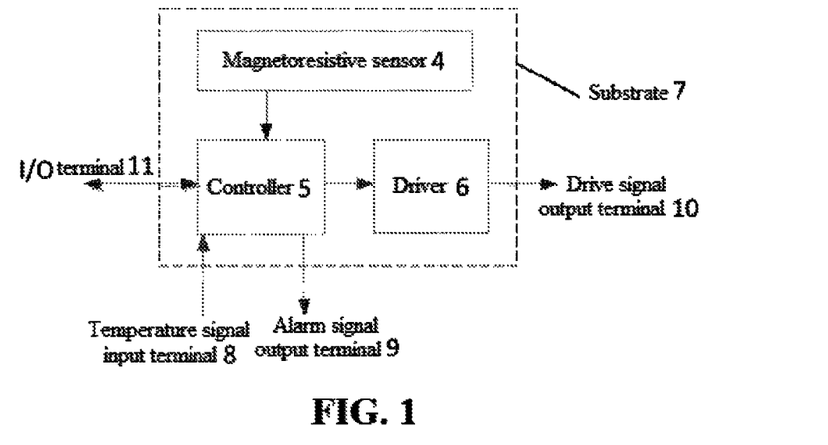
FIG. 1 is a schematic structural diagram of a direct-current fan control chip in the present invention.
Figure 2A:
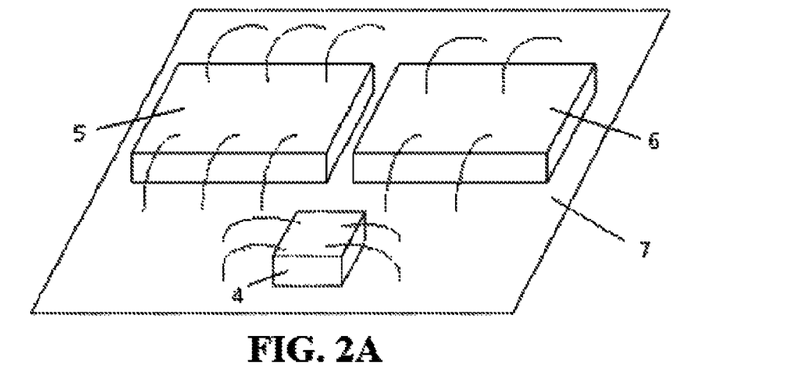
FIGS. 2A-2E are diagrams of position relations between a controller, a driver and a magnetoresistive sensor.
Figure 2B:
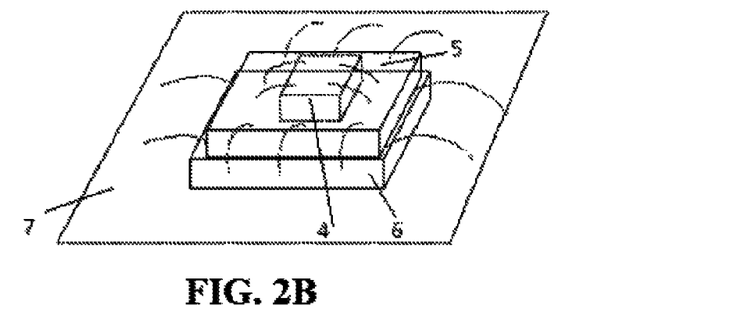
Figure 2C:
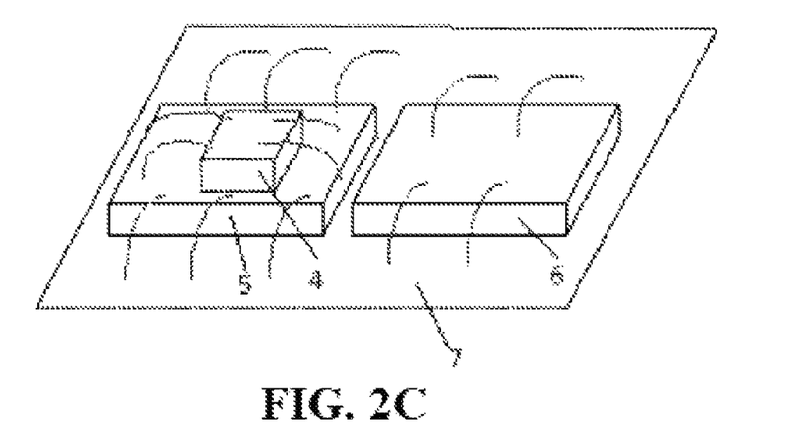
Figure 2D:
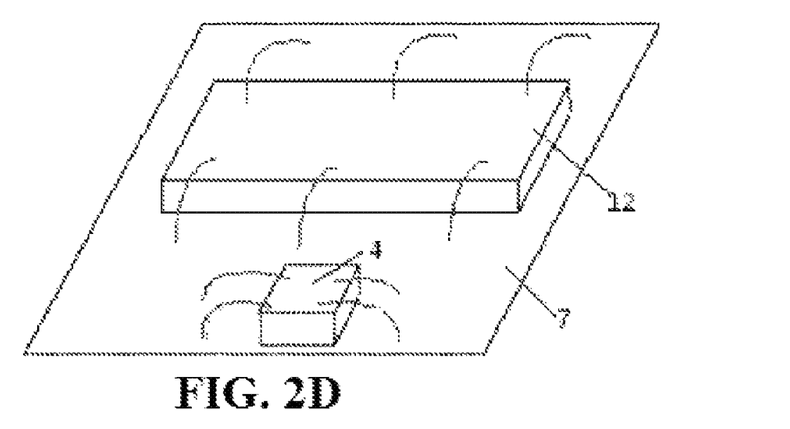
Figure 2E:
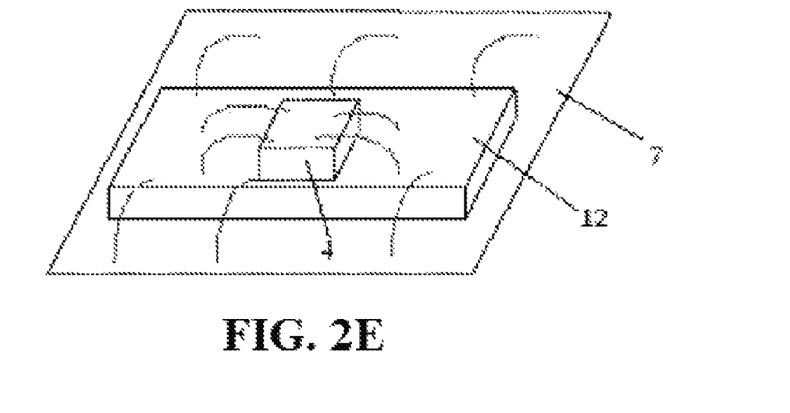
Figure 3:
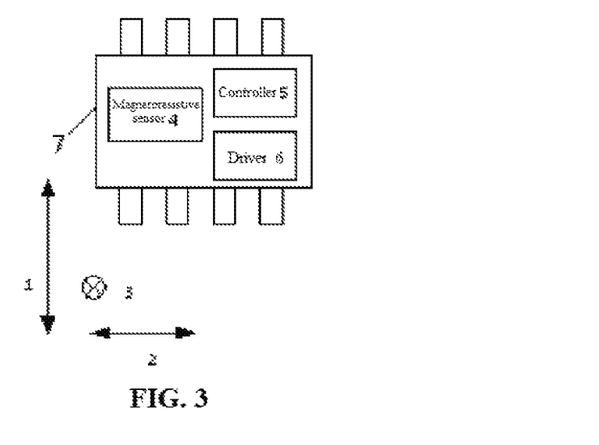
FIG. 3 is a top view of the direct-current fan control chip.
Figure 4A:
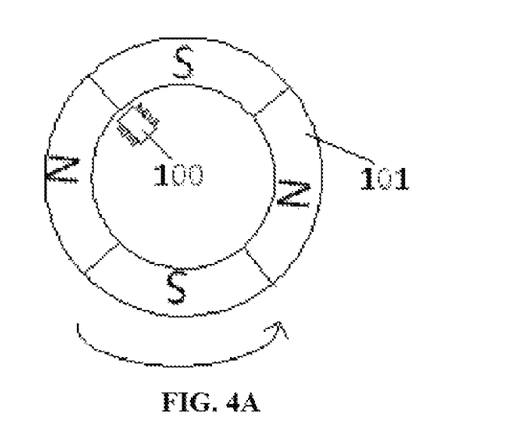
FIGS. 4A-4C are diagrams of a position relation between a permanent magnet rotor and a control chip.
Figure 4B:
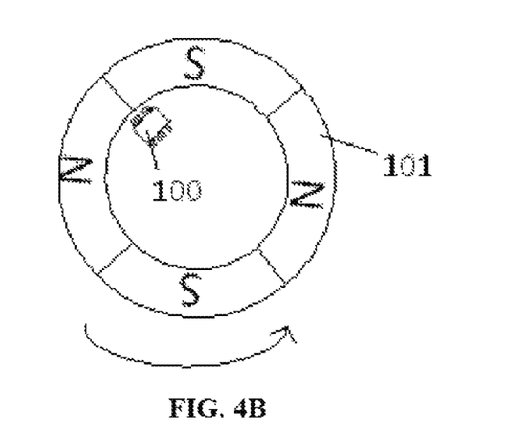
Figure 4C:
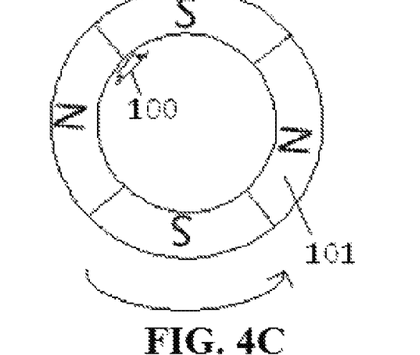

FIG. 1 is a schematic structural diagram of a direct-current fan control chip in the present invention. The control chip includes a magnetoresistive sensor 4, a controller 5 mechanically connected with the magnetoresistive sensor 4, a driver 6 mechanically connected with the controller 5, a substrate 7, a temperature signal input terminal 8, an alarm signal output terminal 9, a drive signal output terminal 10 and a programmable I/O terminal 11. The temperature signal input terminal 8, the alarm signal output terminal 9 and the programmable I/O terminal 11 are disposed on the controller 5, and the drive signal output terminal 10 is disposed on the driver 6. The magnetoresistive sensor 4 is a single-chip sensor formed by InSb elements, TMR elements, GMR elements or AMR elements that are electrically connected. The magnetoresistive sensor 4 may be a single-axis sensor such as an X-axis sensor, a Y-axis sensor or a Z-axis sensor, and may also be a two-axis sensor or a three-axis sensor. The magnetoresistive sensor 4, the controller 5 and the driver 6 may be separately integrated on the substrate 7 as shown in FIG. 2A, they may also be integrated on the substrate 7 in a stacked way as shown in FIG. 2B; however, the upper and lower position relations between them are not limited to those shown in FIG. 2B. The magnetoresistive sensor 4 may be placed above or beneath the controller 5 and may also be placed above or beneath the driver 6. FIG. 2C shows a situation where the magnetoresistive sensor 4 is placed above the controller 5. In addition, the controller 5 and the driver 6 may be deposited on the same wafer to form a control driver 12. At this point, the magnetoresistive sensor 4 may be placed to be separated from the control driver 12 as shown in FIG. 2D, and may also be placed above or beneath the control driver 12. FIG. 2E shows a situation where the magnetoresistive sensor 4 is placed above the control driver. The magnetoresistive sensor 4, the controller 5 and the driver 6 may also be deposited on the same wafer to form an inductive control driver, and the inductive controller is located on the substrate 7, which is not shown in the figure. The sensing direction of the magnetoresistive sensor 4 may be parallel to the surface of the control chip 100 (which is the surface of the packaged chip herein, generally parallel to the surface of the substrate), that is, the direction 1 or 2 in FIG. 3. At this point, the position relation between the control chip 100 and a permanent magnet rotor 101 in the fan is as shown in FIG. 4A and FIG. 4B, where the magnetoresistive sensor 4 is an X-axis sensor and a Y-axis sensor. The sensing direction of the magnetoresistive sensor 4 may also be perpendicular to the surface of the control chip 100, as shown by the direction 3 in FIG. 3. At this point, the position relation between the control chip 100 and the permanent magnet rotor 101 in the fan is as shown in FIG. 4C, where the magnetoresistive sensor 4 is a Z-axis sensor. The sensing direction of the control chip 100 is the same as that of the magnetoresistive sensor 4. After the permanent magnet rotor 101 begins to rotate, the magnetoresistive sensor 4 transmits a rotor position signal, a rotor speed signal, and a rotor rotation direction signal to the controller 5 according to the operating state of the permanent magnet rotor 101. The controller 5 outputs a control signal according to the received signals. In this embodiment, specifically, the controller 5 outputs two PWM signals to the driver 6. The driver 6 outputs a drive signal according to the received control signal, that is, the PWM signals, so as to control N-pole and S-pole directions of a stator coil. The output of the magnetoresistive sensor 4 determines the output of the driver 6, thus determining the change of the current in the inductor, to control the rotation of the permanent magnet rotor. The rotation speed is determined by the duty cycle of an input temperature signal and the PWM signal.

The direct-current fan control chip in the present invention may be packaged in the following forms: SIP, SOP, QFN, DFN, BGA, LGA, PGA, TO, QFP, SOT, LCC, COB, COC, CSP, MCM, ceramic shell package or the like. The direct-current fan control chip is packaged by SOP8 in FIG. 3. When the direct-current fan control chip is packaged by SOP, TO or the like, the substrate is a metal lead frame. When the direct-current fan control chip is packaged by LGA, the substrate is a PCB. In addition, the substrate may also be ceramic.

Figure 5A:
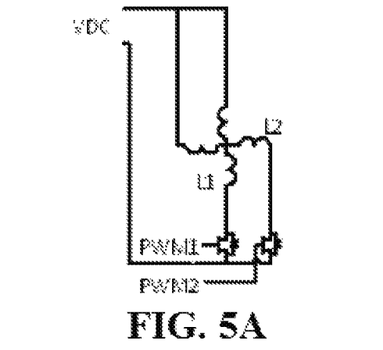
FIGS. 5A-5B are a schematic circuit diagram and a phase control sequence diagram respectively.
Figure 5B:
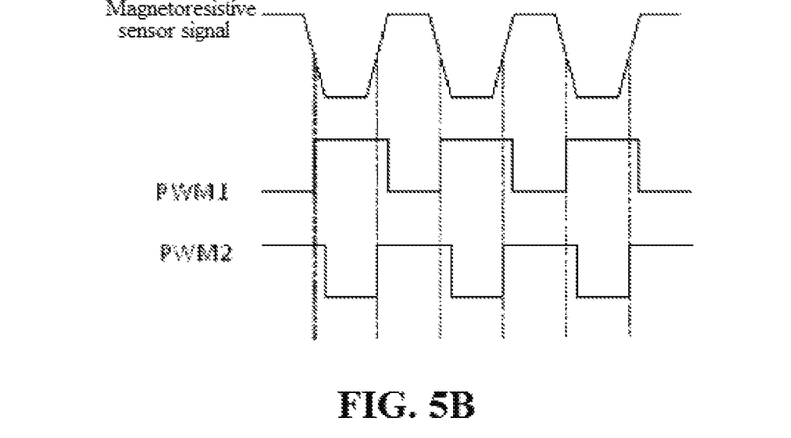

FIGS. 5A and 5B are a schematic circuit diagram and a phase control sequence diagram respectively. After receiving the signals transmitted by the magnetoresistive sensor 4, the controller 5 outputs PWM1 and PWM2 signals to the driver 6. Trigger points of the PWM1 and PWM2 signals are a falling edge and a rising edge of the signals of the magnetoresistive sensor 4, respectively. When the PWM1 and PWM2 signals are triggered, they will be converted from a low level to a high level. At this point, the driver may output a corresponding drive signal to cause the stator coil to change the N-pole and S-pole directions.

Figure 6A:
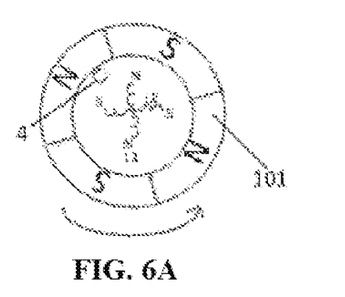
FIGS. 6A-6E are polarity sequence diagrams of stator coils.
Figure 6B:
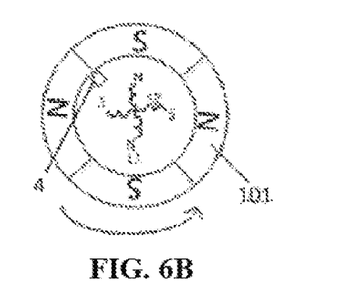
Figure 6C:
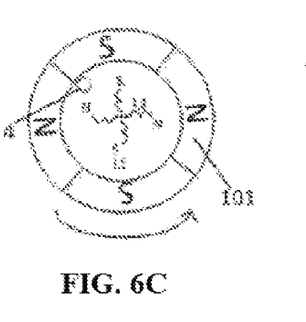
Figure 6D:
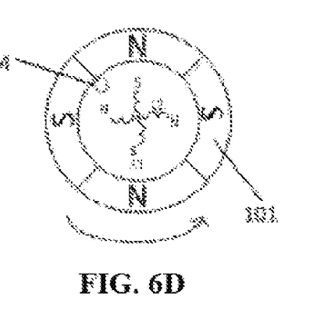
Figure 6E:
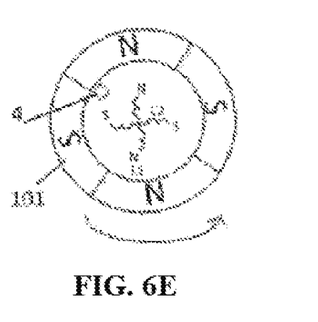

FIGS. 6A-6E are polarity sequence diagrams of stator coils. In the figures, coils L1 and L2 are placed horizontally and vertically, respectively. If the coils L1 and L2 are taken as horizontal and vertical axes and their intersection point is the origin, the magnetoresistive sensor 4 is mounted at the position of 135 degrees of the coordinate axis. FIG. 6A indicates that the permanent magnet rotor begins to rotate, and when the permanent magnet rotor rotates to that its N pole and S pole are aligned with the stator coil L2 whose polarity is S pole and the stator coil L1 whose polarity is N pole respectively, the magnetoresistive sensor sends a commutation signal, as shown in FIG. 6B. FIG. 6C indicates that, after commutation, the permanent magnet rotor continuously rotates, and when the N pole and the S pole of the permanent magnet rotor are aligned with the stator coil L1 whose polarity is S pole and the stator coil L2 whose polarity is N pole respectively once again, the magnetoresistive sensor sends a commutation signal once again, as shown in FIG. 6D. FIG. 6E indicates that, after another commutation, the permanent magnet rotor continuously rotates and then can return to the state shown in FIG. 6A, and the process repeats so.

The present invention is described in detail above by means of preferred embodiments, but the present invention is not limited thereto. Those skilled in the art can make various modifications according to the principle of the present invention. Therefore, any modification made according to the principle of the present invention should all be construed as falling within the protection scope of the present invention.

The invention claimed is:

1. A packaged direct-current fan control chip for controlling a fan that has a permanent magnet rotor and has stator coils arranged to form an angle between the stator coils, the packaged direct current fan control chip comprising:
a chip package having a top surface;
a magnetoresistive sensor having a sensing direction,
a controller,
a driver, and
a substrate,
wherein the magnetoresistive sensor, the controller and the driver are all integrated on the substrate and contained within the chip package,
wherein the sensing direction of the magnetoresistive sensor is perpendicular to or parallel to the top surface of the chip package, and the chip package is configured to be positioned to bisect the angle and the magnetoresistive sensor within the chip package is configured to detect a position, speed and rotation direction of the permanent magnet rotor,
wherein the magnetoresistive sensor provides the controller with a rotor position signal, a rotor speed signal, and a rotor rotation direction signal based on the detected position, speed and rotation direction of the permanent magnet rotor, and
wherein the controller outputs a control signal to the driver according to the received signals, after receiving the control signals, the driver outputs a drive signal to drive the stator coils.

2. The packaged direct-current fan control chip according to claim 1, wherein the magnetoresistive sensor is a single-chip sensor, and is formed by InSb elements, TMR elements, GMR elements or AMR elements that are electrically connected.

3. The packaged direct-current fan control chip according to claim 1, wherein the magnetoresistive sensor is a single-axis sensor, a two-axis sensor or a three-axis sensor.

4. The packaged direct-current fan control chip according to claim 3, wherein the single-axis sensor is an X-axis sensor, a Y-axis sensor or a Z-axis sensor.

5. The packaged direct-current fan control chip according to claim 1, wherein the magnetoresistive sensor, the controller and the driver are separately integrated on the substrate.

6. The packaged direct-current fan control chip according to claim 1, wherein the magnetoresistive sensor, the controller and the driver are stacked.

7. The packaged direct-current fan control chip according to claim 1, wherein the magnetoresistive sensor is located above or beneath the controller.

8. The packaged direct-current fan control chip according to claim 1, wherein the magnetoresistive sensor is located above or beneath the driver.

9. The packaged direct-current fan control chip according to claim 1, wherein the controller and the driver are deposited on a wafer to form a control driver, the control driver being located on the substrate.

10. The packaged direct-current fan control chip according to claim 9, wherein the magnetoresistive sensor is located above or beneath the control driver.

11. The packaged direct-current fan control chip according to claim 1, wherein the controller, the driver and the magnetoresistive sensor are deposited on a wafer to form an inductive control driver, the inductive control driver being located on the substrate.

12. The packaged direct-current fan control chip according to claim 1, wherein the direct-current fan control chip further comprises terminals extending outside of the chip packaging, wherein the terminal include: a temperature signal input terminal, a drive signal output terminal, an alarm signal output terminal and a programmable I/O terminal.

13. The packaged direct-current fan control chip according to claim 12, wherein the temperature signal input terminal, the alarm signal output terminal and the programmable I/O terminal are all disposed on the controller, and the drive signal output terminal is disposed on the driver.

14. The packaged direct-current fan control chip according to claim 1, wherein the direct-current fan control chip is packaged in the following forms: SIP (single in-line package), DIP (dual inline package), SOP (small outline package), QFN (quad flat non-leaded package), DFN (dual flat non-leaded package), BGA (Ball Grid Array), LGA (land grid array), PGA (pin-grid array), TO (transistor out-line), QFP (quad flat package), SOT (small out-line transistor), LCC (lead on chip), COB (chip on board), COC (ceramic substrate on chip), CSP (chip scale package), MCM (multi-chip module) or ceramic shell package.

15. The packaged direct-current fan control chip according to claim 1, wherein the control signal comprises at least one PWM (Pulse Width Modulation) signal.

16. The packaged direct-current fan control chip according to claim 1, wherein the substrate has a surface that is generally parallel to the top surface of the chip package.

17. The packaged direct-current fan control chip according to claim 1, wherein the magnetoresistive sensor includes Tunneling Magnetoresistive (TMR) elements.

18. The packaged direct-current fan control chip according to claim 1, wherein the magnetoresistive sensor includes GMR, AMR or InSB elements.

19. A direct-current fan control chip comprising:
a magnetoresistive sensor having a sensing direction,
a controller,
a driver, and
a substrate,
wherein the direct-current fan control chip has a surface and the sensing direction of the magnetoresistive sensor is perpendicular to or parallel to the surface of the direct-current fan control chip, wherein the magnetoresistive sensor provides the controller with a rotor position signal, a rotor speed signal, and a rotor rotation direction signal, wherein the controller outputs a control signal to the driver according to the received signals, after receiving the control signals, the driver outputs a drive signal, wherein the magnetoresistive sensor, the controller and the driver are all integrated on the substrate, and wherein the controller, the driver and the magnetoresistive sensor are deposited on the same wafer to form an inductive control driver, the inductive control driver being located on the substrate.

20. The direct-current fan control chip according to claim 19, further comprising:
a chip package containing the substrate, the driver, the controller and the magnetoresistive sensor, and
a drive signal output terminal electrically connected to the driver and extending out of the chip package.

* * * * *

UNITED STATES PATENT AND TRADEMARK OFFICE
CERTIFICATE OF CORRECTION

PATENT NO. : 9,957,967 B2
APPLICATION NO. : 15/304285
DATED : May 1, 2018
INVENTOR(S) : Guo et al.

Page 1 of 1

It is certified that error appears in the above-identified patent and that said Letters Patent is hereby corrected as shown below:

On the Title Page

In item (*), in "Notice", in Column 1, Line 3, delete "days. days." and insert --days.-- therefor In item (30), in "Foreign Application Priority Data", in Column 1, Line 1, delete "2014 2 0178713 U" and insert --201420178713.2-- therefor Signed and Sealed this
Twenty-eighth Day of May, 2019

Andrei Iancu
*Director of the United States Patent and Trademark Office*